(12) United States Patent
Goldfarb et al.

(10) Patent No.: US 11,500,290 B2
(45) Date of Patent: Nov. 15, 2022

(54) ADHESION PROMOTERS

(71) Applicant: International Business Machines Corporation, Armonk, NY (US)

(72) Inventors: Dario Goldfarb, Dobbs Ferry, NY (US); Bharat Kumar, Tarrytown, NY (US); Ekmini Anuja De Silva, Slingerlands, NY (US); Jing Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 16/188,392

(22) Filed: Nov. 13, 2018

(65) Prior Publication Data

US 2020/0150532 A1     May 14, 2020

(51) Int. Cl.
    *G03F 7/075*      (2006.01)
    *C08G 77/00*      (2006.01)
    (Continued)

(52) U.S. Cl.
    CPC .......... *G03F 7/0755* (2013.01); *C08G 77/00* (2013.01); *C09J 183/04* (2013.01); *G03F 7/0751* (2013.01); *H01L 21/0273* (2013.01)

(58) Field of Classification Search
    None
    See application file for complete search history.

(56) References Cited

U.S. PATENT DOCUMENTS 4,461,867 A     7/1984    Surprenant
5,057,396 A *   10/1991    Tanaka .................. C08G 77/06
                                                   430/197

(Continued)

FOREIGN PATENT DOCUMENTS

JP          61233034 A    *   10/1986
JP        2005154609 A    *   6/2005
WO    WO-2020013119 A1   *   1/2020  ........... H01L 21/304

OTHER PUBLICATIONS

Condensation of Diphenylsilane Diol through Organostannoxane Catalysis: A Case Study Jul. 28, 2000.

(Continued)

*Primary Examiner* — Randy P Gulakowski
*Assistant Examiner* — Ha S Nguyen
(74) *Attorney, Agent, or Firm* — Fleit Intellectual Property Law; Jon Gibbons

(57) ABSTRACT

An adhesion promoter composition comprising at least one of the following compounds:

(a) a cyclic compound having the formula:

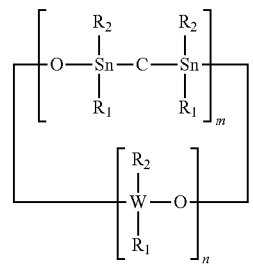

(b) a non-cyclic compound having the formula:

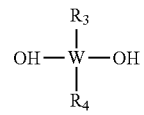

wherein $R_1$ and $R_2$ each independently represents a non-photoactive phenyl, a photoactive phenyl or a $C_1$-$C_4$ alkyl; $R_3$ represents a non-photoactive phenyl; $R_4$ represents a photoactive phenyl; W represents Si or Ge; n represents an integer of value greater than 1;

m represents an integer between 0 and 1.

21 Claims, 10 Drawing Sheets

(51) Int. Cl.
      *C09J 183/04*     (2006.01)
      *H01L 21/027*    (2006.01)
      *H01L 21/033*    (2006.01)
      *G03F 7/16*       (2006.01)

(56) References Cited

U.S. PATENT DOCUMENTS

| | | | |
|---|---|---|---|
| 6,455,443 B1 * | 9/2002 | Eckert | H01L 21/76829 |
| | | | 438/781 |
| 6,616,976 B2 | 9/2003 | Montano et al. | |
| 6,674,140 B2 | 1/2004 | Martin | |
| 6,780,517 B2 | 8/2004 | Chen et al. | |
| 7,867,331 B2 | 1/2011 | Kennedy et al. | |
| 8,084,193 B2 | 12/2011 | Cheng et al. | |
| 8,652,762 B2 | 2/2014 | Goldfarb et al. | |
| 8,691,389 B2 | 4/2014 | Fu et al. | |
| 8,772,376 B2 | 7/2014 | Huang et al. | |
| 9,069,133 B2 | 6/2015 | Baldwin et al. | |
| 2006/0211240 A1 * | 9/2006 | Chi | H01L 21/3122 |
| | | | 438/644 |
| 2011/0111604 A1 | 5/2011 | Kim et al. | |
| 2018/0233363 A1 | 8/2018 | Glodde et al. | |
| 2019/0211210 A1 * | 7/2019 | Wojtczak | C08K 5/09 |

OTHER PUBLICATIONS

Adhesion promoter HMDS and diphenylsilanedio (AR 300-80) Oct. 4, 2018.

* cited by examiner 30P (NON-OPTIMIZED RET)

ADHESION PROMOTERS

BACKGROUND OF THE INVENTION

The present disclosure generally relates to the field of semiconductors, and more particularly relates to promoters for photoresist in semiconductor fabrication.

Photolithography is used as part of the semiconductor manufacturing process to delineate patterns representing particular device or circuit structures on the surface of a silicon wafer. This pattern is made with photoresist, which protects the substrate underneath it from subsequent processing. The physical or electrical characteristics of the unprotected surfaces are altered by process steps such as etch, deposition, ion implantation, sputtering, etc. This cycle is repeated many times.

One type of photolithography is Extreme Ultra Violet (EUV) lithography. EUV lithography is a next-generation lithography technology using an extreme ultraviolet wavelength, currently expected to be 13.5 nm. EUV allows for feature patterning at smaller dimensions than other conventional photolithographic processes. The use of EUV lithography typically requires improved molecular primer chemistry to provide sufficient adhesion and a residue-free underlayer to the hardmask-EUV resist interface. The use of EUV enabling a smaller feature width decreases the area available for the patterned photoresist structure to adhere to the underlying substrate. Therefore, the adhesion strength between the pattern material and the underlying substrate is weakened.

SUMMARY OF THE INVENTION

In one embodiment, an adhesion promoter composition is disclosed. The adhesion promoter composition comprises at least one of the following compounds:

(a) a cyclic compound having the formula:

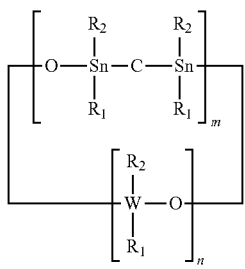

(b) a non-cyclic compound having the formula:

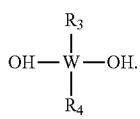

The $R_1$ and $R_2$ each independently represent a non-photoactive phenyl, a photoactive phenyl or a $C_1$-$C_4$ alkyl; $R_3$ represents a non-photoactive phenyl; $R_4$ represents a photoactive phenyl. W represents Si or Ge; n represents an integer of value greater than 1 and m represents an integer integer between 0 and 1.

In another embodiment, a semiconductor surface with a film coating composition is disclosed. The film coating composition comprising at least one of the following compounds.

a cyclic compound having the formula:

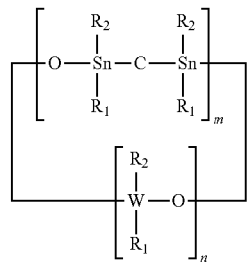

a non-cyclic compound having the formula:

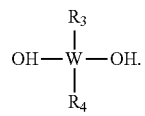

The R1 and R2 each independently represents a non-photoactive phenyl, a photoactive phenyl or a C1-C4 alkyl; R3 represents a non-photoactive phenyl; R4 represents a photoactive phenyl; W represents Si or Ge; n represents an integer of value greater than 1; and m represents an integer between 0 and 1.

The cyclic compound can be any of hexaphenylcyclotrisiloxane, octaphenylcyclotetrasiloxane, 2,4,6-Trimethyl-2,4,6-triphenylcyclotrisiloxane, dodecamethylcyclohexasiloxane, 1,1,3,3,5,5,7,7-Octaphenyl-4,6,8-trioxa-1,3-distanna-5,7-disilacyclooctane, 1,1,3,3,5,5,7,7,9,9-Decaphenyl-4,6,8,10-tetraoxa-1,3-distanna-5,7,9-trisilacyclodecane, 1,1,3,3,5,5,7,7,9,9,11,11-Dodecaphenyl-4,6,8,10,12-pentaoxa-1,3-distanna-5,7,9,11-tetrasilacyclododecane, 1,1,3,3-Tetraphenyl-5,5-di-tert-butyl-4,6-dioxa-1,3-distanna-5-silacyclohexane, 1,1,3,3-Tetraphenyl-5,5-di-tert-butyl-4,6-dioxa-1,3-distanna-5-germacyclohexane, triphenylsulfonium 4-phenylsulfonate-2,2,4,6,6-pentaphenyl-cyclotrisiloxane, triphenylsulfonium 4-phenylsulfonate 2,2,4,6,6,8,8-heptaphenyl-cyclotetrasiloxane, triphenylsulfonium 5-phenylsulfonate-1,1,3,3,5,7,7,9,9-nonaphenyl-4,6,8,10-tetraoxa-1,3-distanna-5,7,9-trisilacyclodecane and phenylsulfonate monophenylsilanediol.

BRIEF DESCRIPTION OF THE DRAWINGS

The accompanying figures refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
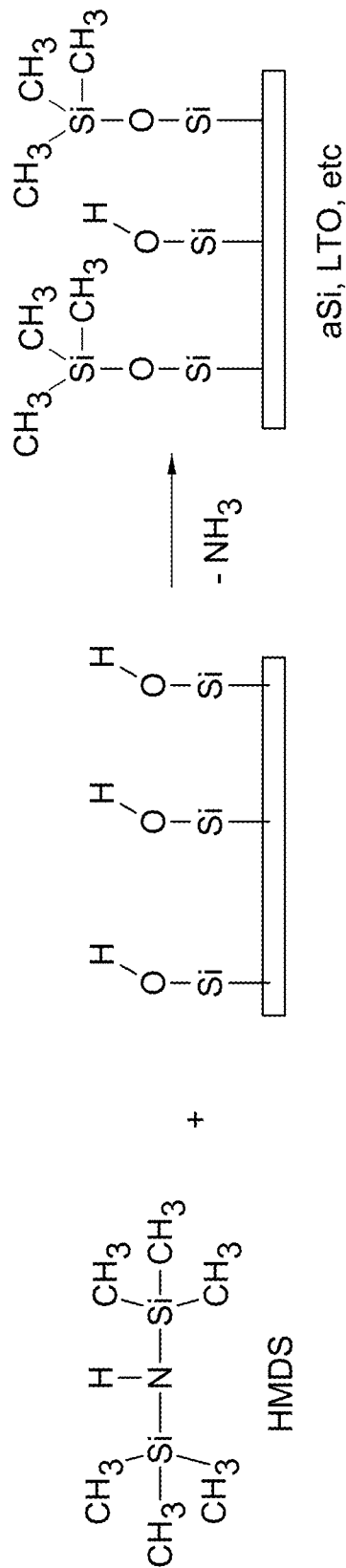
FIG. 1 illustrates the chemical reaction of HMDS with a substrate.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 14:
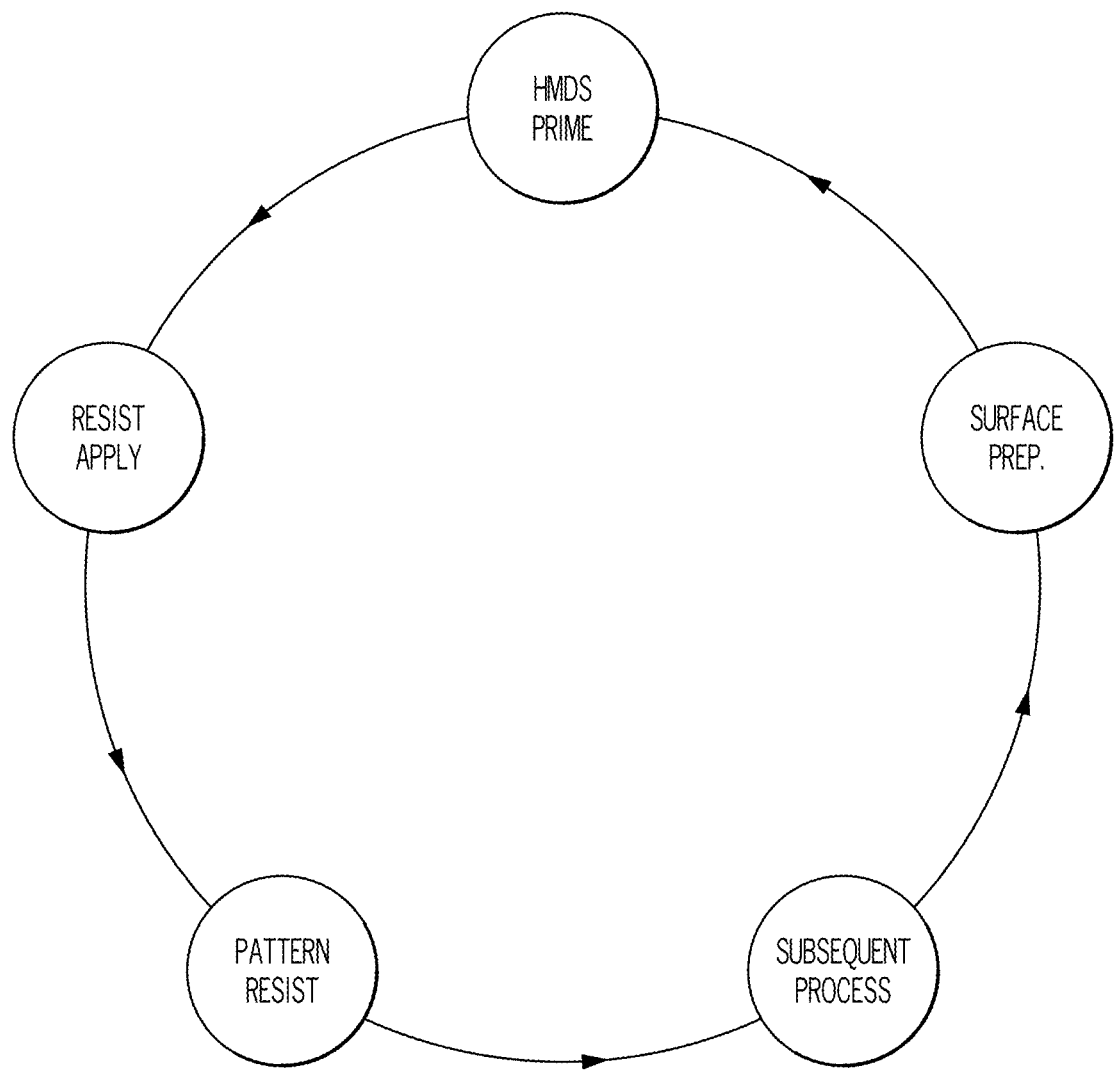
FIG. 14 illustrates the sequence of a typical semiconductor manufacturing process.

A typical semiconductor manufacturing process is mechanical or chemical "surface preparation" followed by "HMDS Prime", followed by "Resist Apply", followed by "Pattern Resist", and "Subsequent Process", as shown in FIG. 14. This cycle is repeated many times until the device fabrication is completed. The HDMS prime operation is performed to apply Hexamethyldisilizane (HMDS) as a photoresist adhesion promoter. Photoresist adhesion promoters such as HMDS are typically utilized to enhance/increase adhesion between a photoresist material and an underlying layer. The chemical reaction for an adhesion promoter, namely, HMDS, is shown in FIG. 1. In particular, HMDS binds to the oxygen atoms of the substrate via its silicon atoms under the removal of ammonia. The resulting non-polar methyl groups create a hydrophobic surface that promotes adhesion.

Figure 2:
FIG. 2 illustrates the use of polymeric primer chemistry to make a thick adhesion layer.
Figure 3:
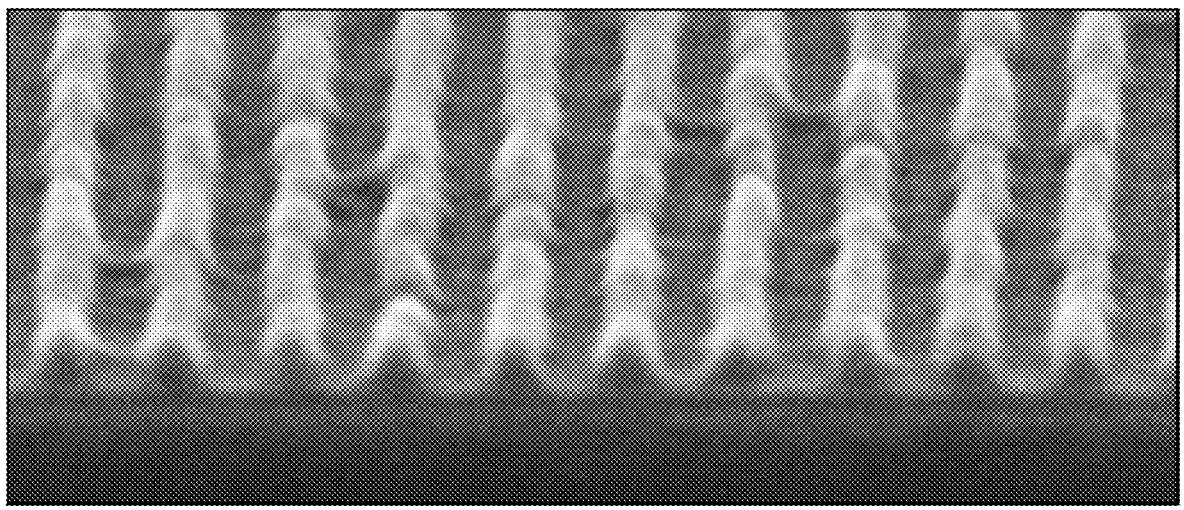
FIG. 3 is a scanning electron microscope image illustrating residue in trenches.
Figure 4:
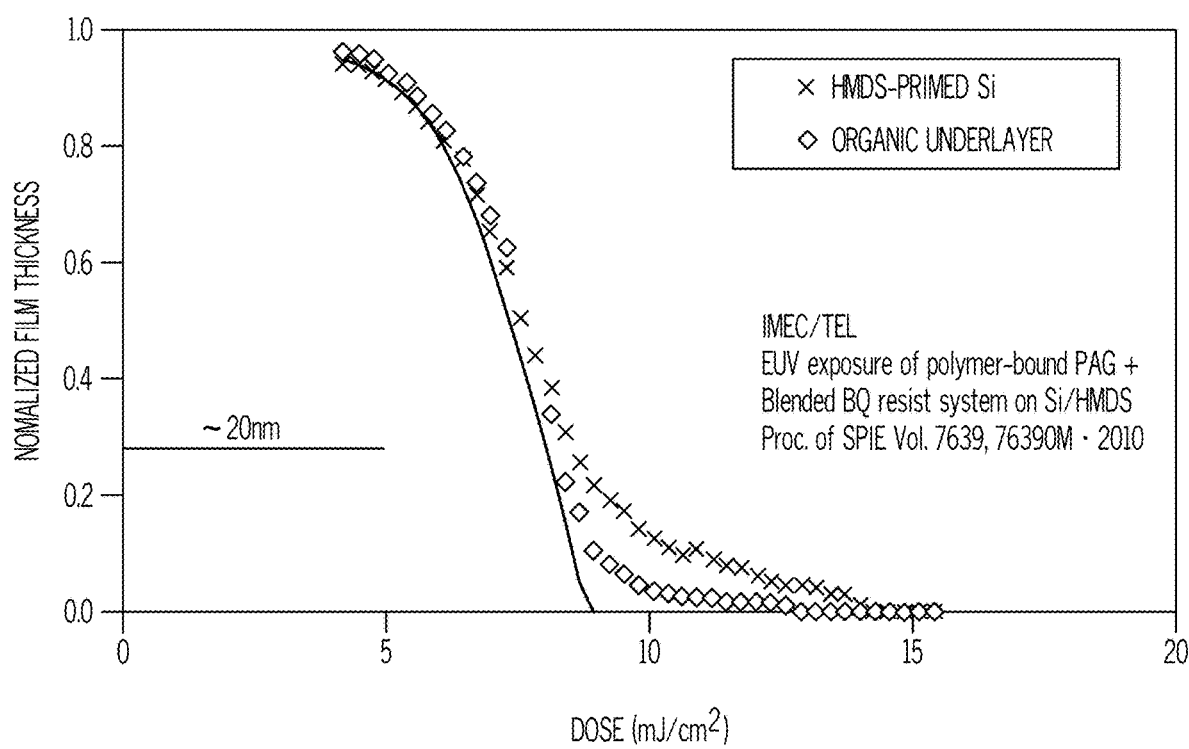
FIG. 4 is a chart illustrating normalized remaining resist film thickness versus EUV dose.

The use of HMDS with EUV lithography oftentimes leads to resist scumming, residue, tailing and macro-bridging. Previous attempts to fix this adhesion problem have been to use polymeric primer chemistry. However, the use of polymeric primer chemistry to make a thick adhesion layer, between 2-5 nm, can lead to increased residue (e.g. non-active polymer brushes) as shown in FIG. 2. This is further shown in FIG. 3, which is a photo taken with a scanning electron microscope that illustrates residue in the trenches of a substrate treated with HMDS with lines 15 nanometers in width with a pitch of 30 nanometers. FIG. 4 is a chart illustrating normalized remaining resist film thickness versus EUV dose.

Further current semiconductor fabrication hardware is designed to apply HMDS as a vapor to the target surface. The current fabrication process does not accept alternative vapor priming chemistry. Therefore, this process restriction excludes other alternatives. Accordingly, what is needed is to provide adhesion between a semiconductor substrate and a photo-sensitive layer or photo-resistive mask used to define the circuitry in a semiconductor device while preventing the formation of resist scumming.

A composition for use as an adhesion promoter in photoresist semiconductor applications is claimed in the subject invention. The adhesion promoters may comprise cyclic compounds generally represented by the following formula:

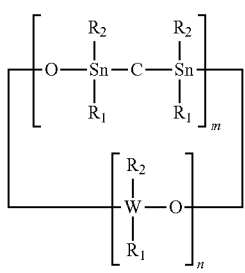

wherein $R_1$ and $R_2$ each independently represents a non-photoactive phenyl, a photoactive phenyl or a $C_1$-$C_4$ alkyl; W represents Si or Ge; n represents an integer of value greater than 1; and m represents an integer between 0 and 1.

Preferred cyclic compounds having the aforementioned formula are: Hexaphenylcyclotrisiloxane ("HPCTS"), wherein m is 0, n is 3, W is Si and $R_1$ and $R_2$ are Phenyl, e.g.,

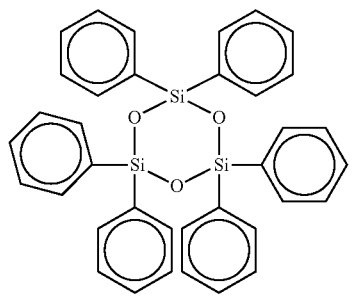

Octaphenylcyclotetrasiloxane, wherein m is 0, n is 4, W is Si and $R_1$ and $R_2$ are Phenyl, e.g.,

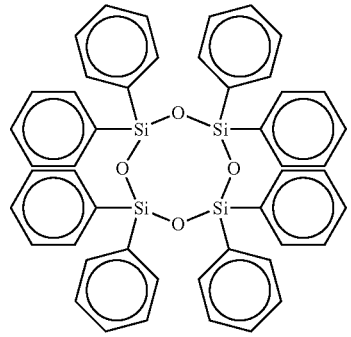

2,4,6-Trimethyl-2,4,6-triphenylcyclotrisiloxane, wherein m is 0, n is 3, W is Si and $R_1$ and $R_2$ are Phenyl or Methyl, e.g.,

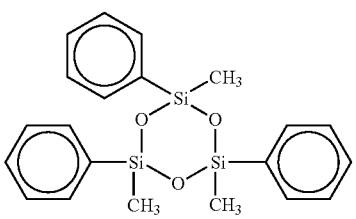

Dodecamethylcyclohexasiloxane, wherein m is 0, n is 6, W is Si and $R_1$ and $R_2$ are Methyl, e.g.,

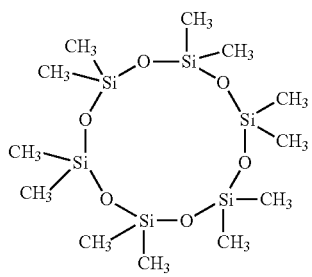

Octaphenyltetrasiloxane ("OPCTS") or 1,1,3,3,5,5,7,7 Octaphenyl-4,6,8-trioxa-1,3-distanna-5,7-disilacyclooctane, wherein m is 1, n is 2, W is Si and $R_1$ and $R_2$ are Phenyl, e.g.,

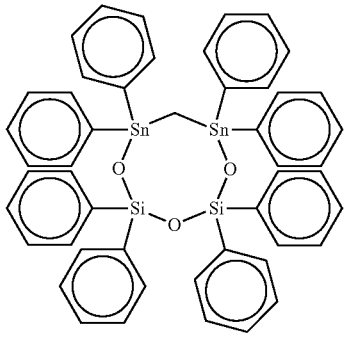

1,1,3,3,5,5,7,7,9,9-Decaphenyl-4,6,8,10-tetraoxa-1,3-distanna-5,7,9-trisilacyclodecane, wherein m is 1, n is 3., W is Si and R1 and R2 are Phenyl, e.g.,

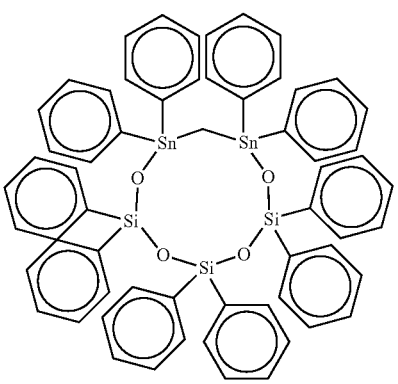

1,1,3,3,5,5,7,7,9,9,11,11-Dodecaphenyl-4,6,8,10,12-pentaoxa-1,3-distanna-5,7,9,11-tetrasilacyclododecane, wherein m is 1, n is 4, W is Si and $R_1$ and $R_2$ are Phenyl, e.g.,

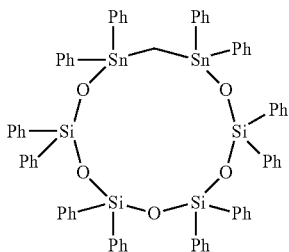 [SMILES: c1ccc([Si]2(c3ccccc3)O[Si](c3ccccc3)(c3ccccc3)O[Si](c3ccccc3)(c3ccccc3)[O][Sn]([c]3ccccc3)([c]3ccccc3)[CH2][Sn]([c]3ccccc3)([c]3ccccc3)[O][Si](c3ccccc3)(c3ccccc3)O2)cc1]

1,1,3,3-Tetraphenyl-5,5-di-tert-butyl-4,6-dioxa-1,3-distanna-5-silacyclohexane, wherein m is 1, n is 1, W is Silicon and $R_1$ and $R_2$ are Phenyl or tert-Butyl, e.g.,

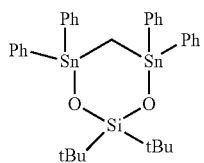

1,1,3,3-Tetraphenyl-5,5-di-tert-butyl-4,6-dioxa-1,3-distanna-5-germacyclohexane, wherein m is 1, n is 1, W is Ge and $R_1$ and $R_2$ are Phenyl or tert-Butyl, e.g.,

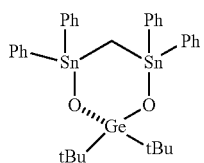

triphenylsulfonium 4-phenylsulfonate-2,2,4,6,6-pentaphenyl-cyclotrisiloxane, wherein m is 0, n is 3, W is Si and $R_1$ and $R_2$ are Phenyl or photoactive Phenyl, e.g.,

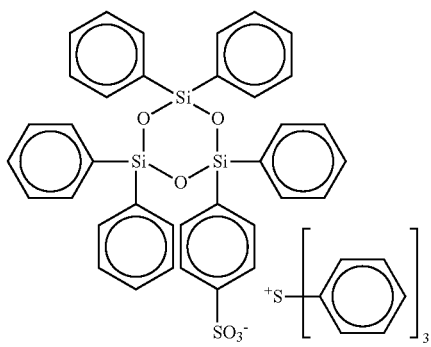

triphenylsulfonium 4-phenylsulfonate 2,2,4,6,6,8,8-heptaphenyl-cyclotetrasiloxane, wherein m is 0, n is 4, W is Si and $R_1$ and $R_2$ are Phenyl or photoactive Phenyl, e.g.,

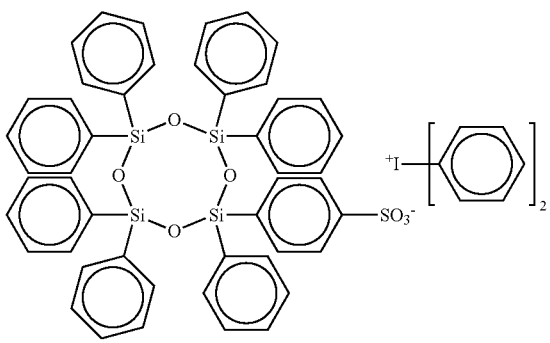

triphenylsulfonium 5-phenylsulfonate-1,1,3,3,5,7,7,9,9-nonaphenyl-4,6,8,10-tetraoxa-1,3-distanna-5,7,9-trisilacyclodecane, wherein m is 1, n is 3, W is Si and $R_1$ and $R_2$ are Phenyl or photoactive Phenyl, e.g.,

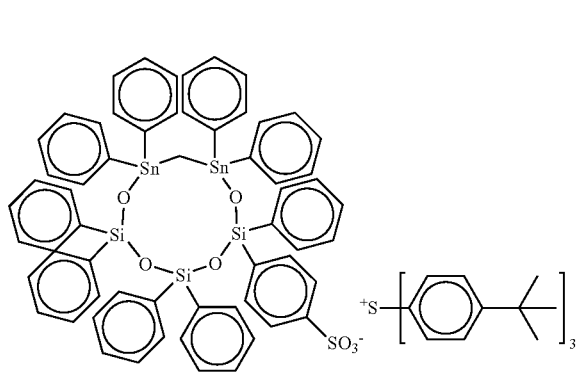

The adhesion promoter may also comprise non-cyclic compounds generally represented by the following formula:

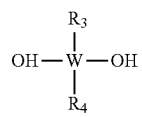

wherein $R_3$ represents a non-photoactive phenyl; $R_4$ represents a photoactive phenyl; and W represents Si or Ge.

Preferred non-cyclic compounds having the aforementioned formula are: TPS phenylsulfonate phenylsilanediol ("TPS-PSPS"); DPI phenylsulfonate phenylsilanediol (DPI-PSPS), wherein W is Si and $R_1$ and $R_2$ are Phenyl or photoactive Phenyl, e.g.,

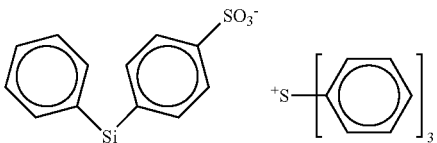

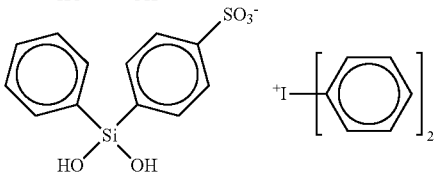

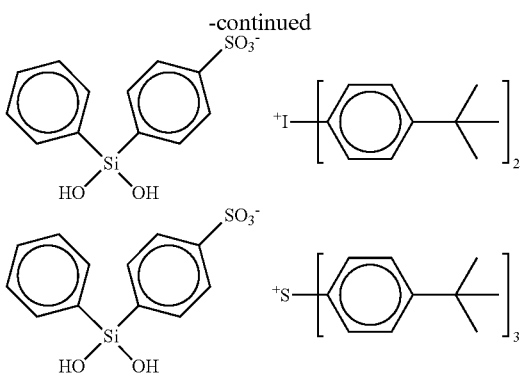

The adhesion promoter composition may comprise at least one of the aforementioned compounds or one or more of the following compounds. For example, the adhesion promoter composition may comprise a mixture of the compounds HPCTS and OPCTS. A composition with a high melting point is generally preferred, e.g., a composition having a melting point greater than 140 C is preferred in order to reduce off gassing when the composition is in a liquid form. Additionally, the aforementioned compounds may be engineered to be non-photo active (e.g., HPCTS and OPCTS) or photoactive (e.g., triphenylsulfonium 4-phenylsulfonate-2,2,4,6,6-pentaphenyl-cyclotrisiloxane and TPS-PSPS) so that the compounds will react to light in photoresist semiconductor applications.

As described in the Journal of the American Chemical Society 1945 5 67 (12), 2173074, Hexaphenylcyclotrisiloxane (HPCTS) may be prepared using ten grams of diphenyl-silanediol dissolved in 150 ml of ether and adding 5 ml of concentrated hydrochloric acid. After heating under reflux for three hours, the ether is removed and the crystals collected. Flat plates are obtained from benzene and ethanol, or glacial acetic acid. HPCTS has a melting point of 190 C and boiling point of 290-300 C (1 mm).

As described in the Journal of the American Chemical Society 1945 5 67 (12), 2173074, Octaphenylcyclotetrasiloxane (OPCTS) may be prepared by adding a drop or two of aqueous caustic to a boiling solution of diphenyl-silanediol in 95% ethanol. On cooling, the tetramer precipitates. When recrystallized from benzene and ethanol, or glacial acetic acid, needles are obtained. OPCTS has a melting point of 201-202 C and a boiling point of 330-340 C (1 mm).

Figure 5:
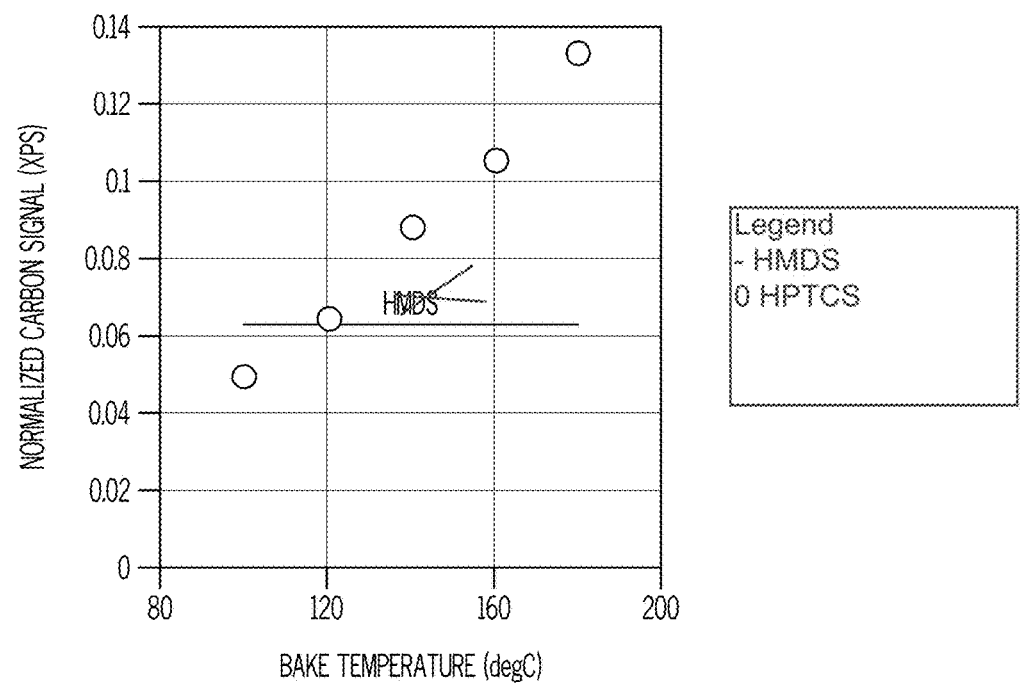
FIG. 5 is a chart of carbon signal in a substrate treated with HPCTS versus bake temperature.

FIG. 5 is a chart of the carbon signal in a substrate treated with HPCTS versus bake temperature. In particular, an HPCTS sample was reacted with a silicon oxide surface and the carbon content left by the presence of the HPCTS sample was measured with X-ray photoelectron spectroscopy (XPS) for different baking temperatures. Referring to FIG. 5, it can be seen that as the baking temperature was increased, the reactivity of HPCTS increased as well, whereas the reactivity of HMDS stays the same over different baking temperatures. Accordingly, unlike HMDS, HPCTS allows for the modulation of carbon content over different baking temperatures. The HPCTS sample measured in FIG. 5 is 1% wt PGMEA (on piranha-treated wafer), coat 1 krpm, PAB 60 s (variable temp), and rinsed with PGMEA.

As shown in the table below, the contact angle of an HPCTS sample is measured over different baking temperatures. In particular, the left most column shows the sample type, the second column shows the baking temperature and time, the third column shows the thickness of the sample in nm and the right most column shows the static contact angle in degrees. The contact the angle is the measure of an angle interface that exists between a liquid and a solid. The contact angle (wetting angle) is a measure of the wettability of a solid by a liquid. The table below therefore illustrates that as the HPCTS sample is baked from 80 C to 180 C the contact angel changes from 17.7 to 50.7 degrees. This indicates that, in addition to the modulation of carbon content over different baking temperatures (as shown in FIG. 5) the contact angle of HPCTS may also be modulated with baking temperature.

TABLE I

| Sample | Bake (Temp/time, min) | Thickness (nm) | Static Contact Angle |
|---|---|---|---|
| Water (std) | | | 1.3 |
| HMDS | | 1.32 | 73.4 |
| DPSD | 80/1 | 1.46 | 31.6 |
| DPSD | 100/1 | 1.67 | 51.9 |
| DPSD | 120/1 | 1.62 | 53.2 |
| DPSD | 140/1 | 1.68 | 60.4 |
| HPCTS | 80/1 | 1.32 | 17.7 |
| HPCTS | 100/1 | 1.38 | 22.5 |
| HPCTS | 120/1 | 1.42 | 32.9 |
| HPCTS | 140/1 | 1.54 | 33.1 |
| HPCTS | 160/1 | 1.72 | 42.3 |
| HPCTS | 180/1 | 1.72 | 50.7 |
| HPCTS* | 180/1 | — | 79.5 |

The DPSD is a reference material for testing spin-on molecular primer. The substrate primed with the HPCTS* sample is piranha cleaned before priming and the rest of samples were prepared using direct Si-wafers.

Figure 6:
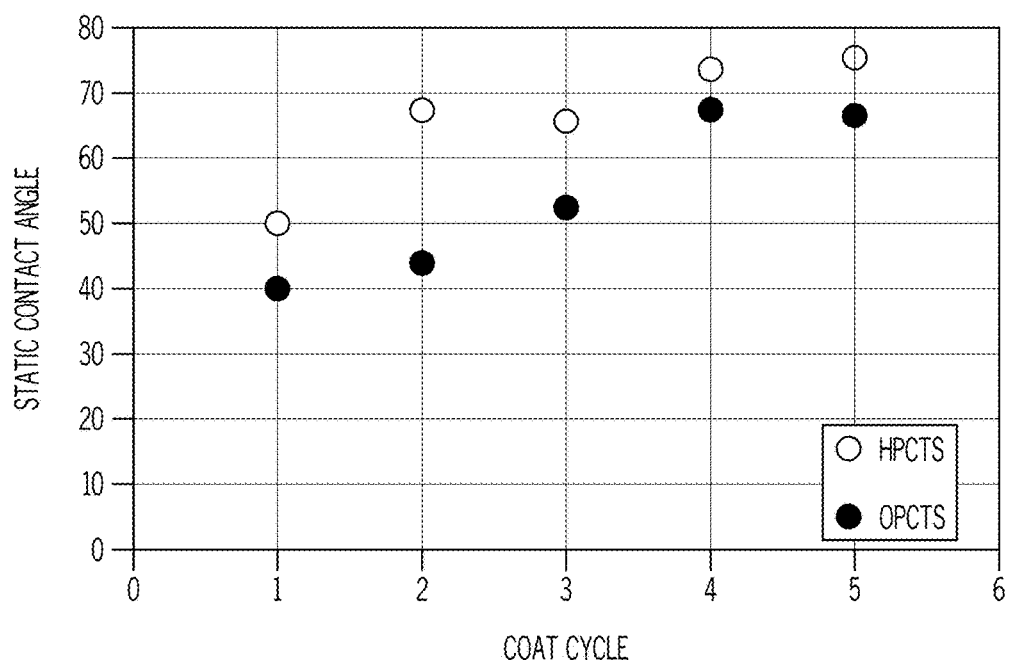
FIG. 6 is a chart illustrating the static contact angle of a substrate treated with an HPCTS sample and an OPCTS sample versus the number of coating cycles.
Figure 7A:
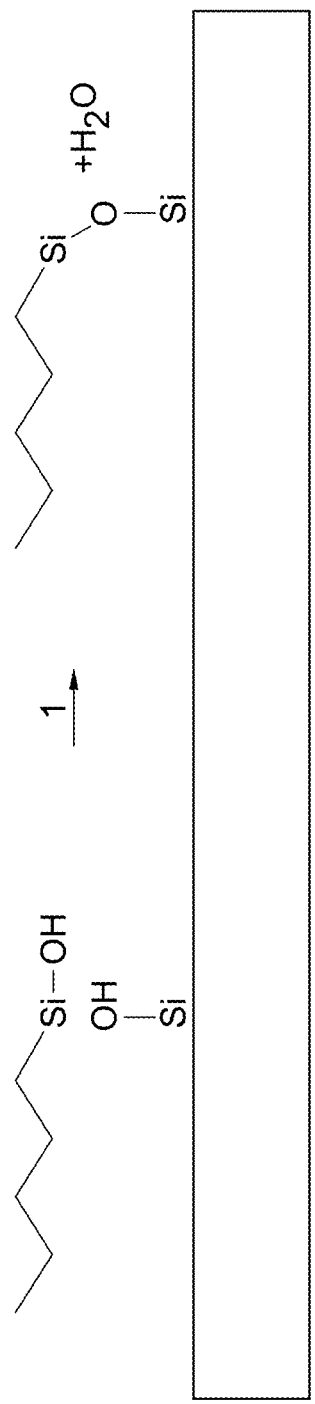
FIG. 7A through FIG. 7D is a series of graphs depicting the possible chemical reactions between the adhesion promoters of the present invention and a semiconductor substrate.
Figure 7B:
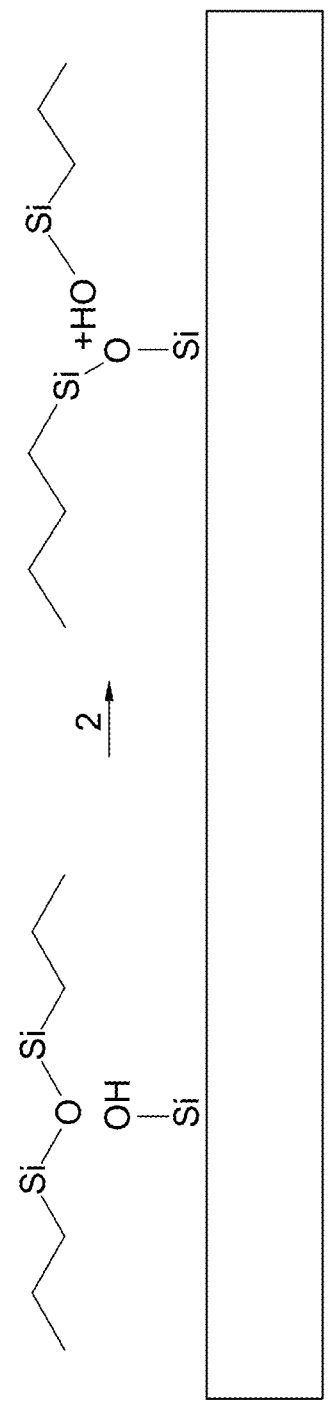
Figure 7C:
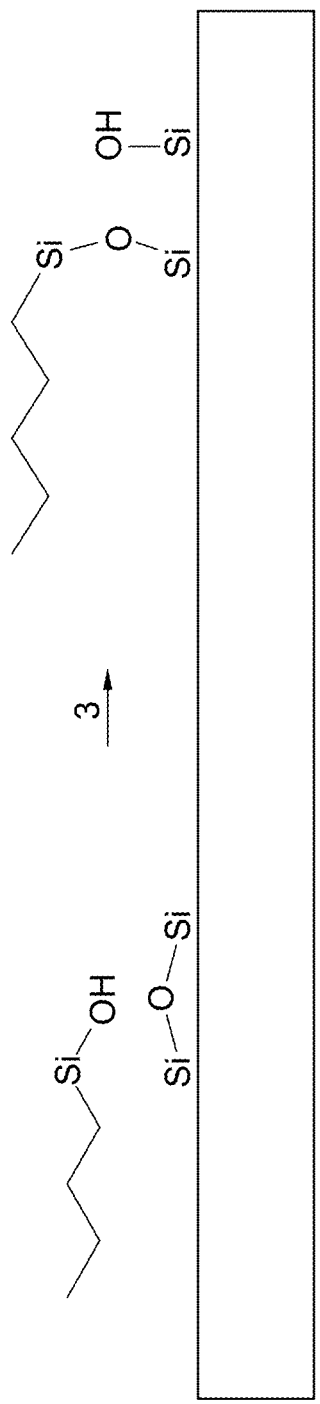
Figure 7D:
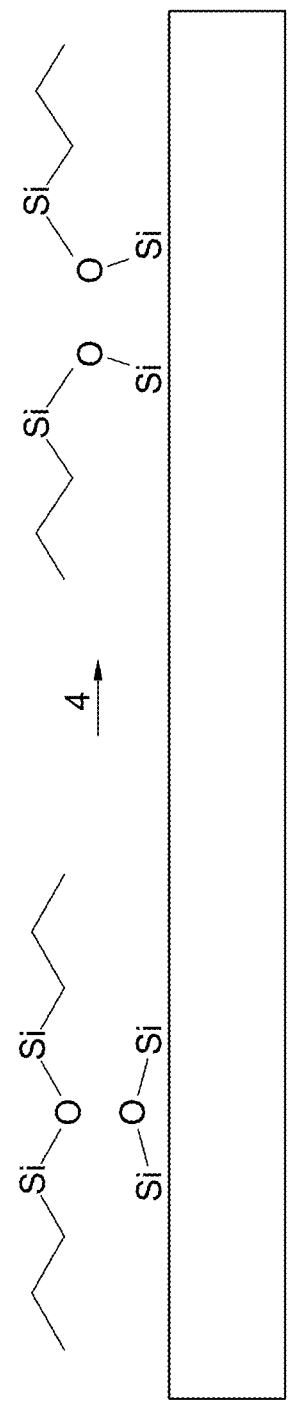

FIG. 6 is a chart illustrating the static contact angle of a substrate treated with an HPCTS sample and an OPCTS sample versus a number of coating cycles. As shown in this chart, another way of modifying the contact angle of the HPCTS and OPCTS samples is with multiple coating cycles. The table below corresponds with FIG. 6 as it shows the specific values of the contact angle for each of the HPCTS and OPCTS samples after multiple coating cycles.

TABLE II

| No. Coats | Sample | Avg. Static CA | Std Dev. |
|---|---|---|---|
| 1 | HPCTS Coat 1 | 50.2 | 3.8 |
| 2 | HPCTS Coat 2 | 67.2 | 4.9 |
| 3 | HPCTS Coat 3 | 65.5 | 2.0 |
| 4 | HPCTS Coat 4 | 73.5 | 1.1 |
| 5 | HPCTS Coat 5 | 75.6 | 1.4 |
| 1 | OPCTS Coat 1 | 40.4 | 8.3 |
| 2 | OPCTS Coat 2 | 44.1 | 12.3 |
| 3 | OPCTS Coat 3 | 52.3 | 6.8 |
| 4 | OPCTS Coat 4 | 67.6 | 1.8 |
| 5 | OPCTS Coat 5 | 66.7 | 1.9 |

Shown in FIG. 7A through FIG. 7D is a series of graphs depicting the possible chemical reactions between the adhesion promoters of the present invention and a semiconductor substrate.

Accordingly, the contact angle can be modulated by baking time, baking temperature and by multiple coating cycles. The substrate is prepared by piranha cleaning blanket Si wafer for 1 min, spin coating OPCTS 1% wt PGMEA sample at 1.0 krpm, PAB 180 C/60 s, PGMEA rinsing, and spin drying. To provide multiple coats, repeat spin coating step of OPCTS 1% wt PGMEA sample.

Figure 8:
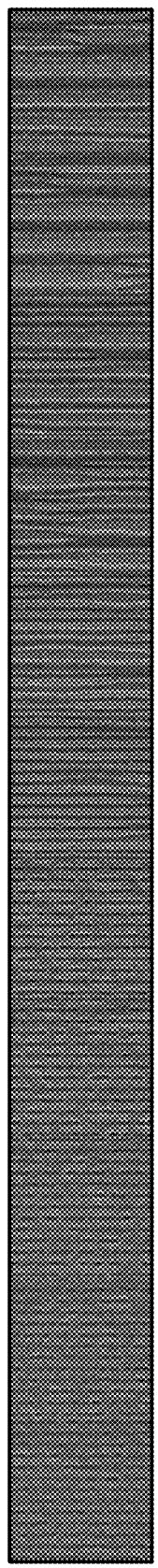
FIG. 8 is a scanning electron microscope image of a substrate of a semiconductor wafer IRAD oxide primed with HMDS.

FIG. 8 is a scanning electron microscope image of a substrate of a semiconductor wafer IRAD oxide primed with HMDS. Lithography Conditions are Mask: Porter M3A RET: DoeID 30063 Substrate: bare Si wafer with 50 A IRAD oxide HPCTS 1% PGMEA (1.5 krpm), 180 C/3 min (no HMDS) Resist=Commercial EUV Resist.

FIG. 8 shows a photoresist is patterned at 18 nanometer lines and spaces with a pitch of 36 nanometers on silicon oxide surface that has been primed with HMDS. Going from left to right the material on the left is under dosed so shown is little modulation in the lines and spaces. Going to the right the modulation is more noticeable but the lines and spaces are shifted. This shifting illustrates where the adhesion has failed to happen.

Figure 9:
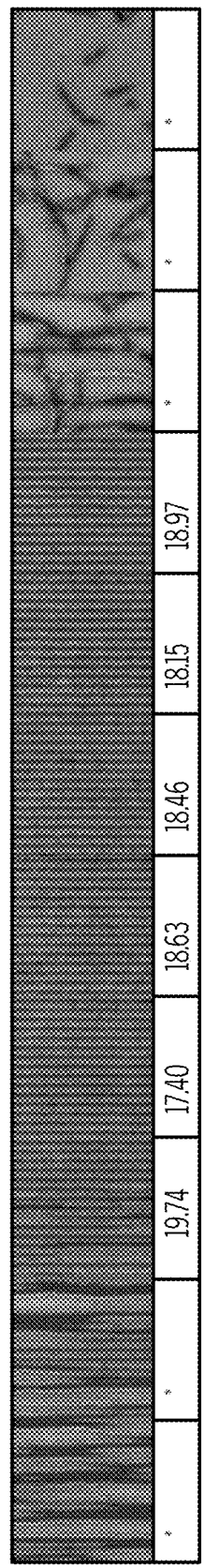
FIG. 9 is a scanning electron microscope image of a substrate of a semiconductor wafer of IRAD oxide primed with HPCTS.

FIG. 9 is a scanning electron microscope image of a substrate of a semiconductor wafer IRAD oxide primed with HPCTS with a pitch of 30 nanometers. The center of wafer shows good adhesion because the lines and spaces are clearly visible and are not merged. The extreme left and the extreme right shows uneven lines and spaces. This center-to-edge variability is probably due to uneven coating.

Figure 10:
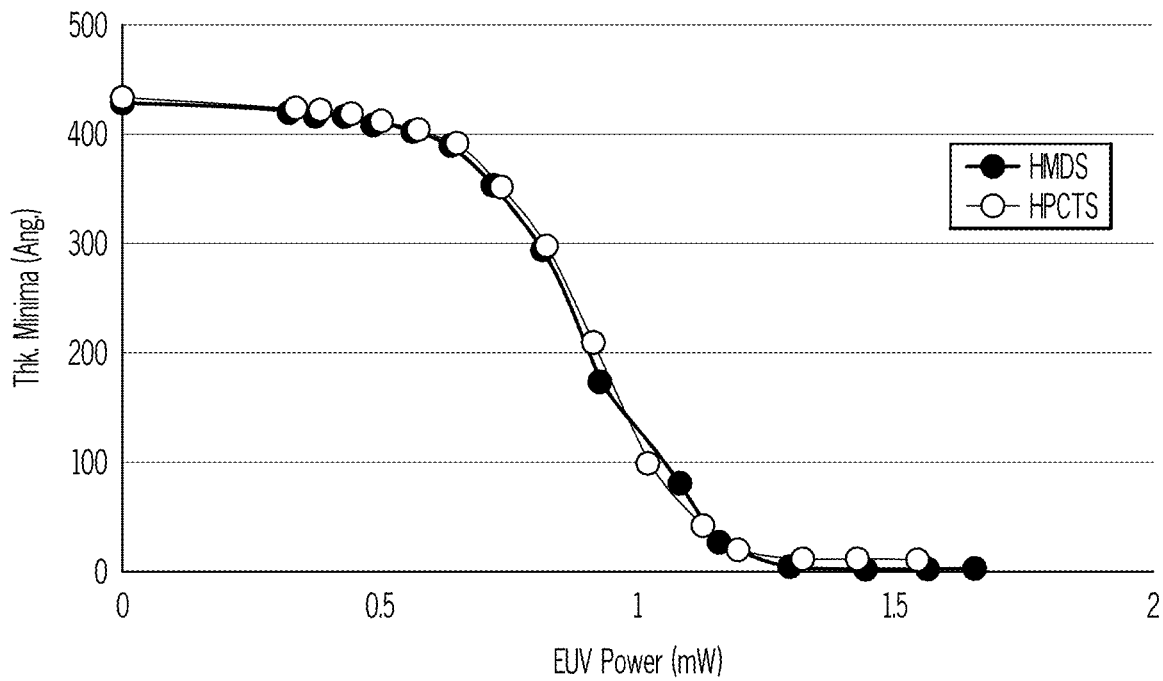
FIG. 10 is a graph illustrating the average thickness of HMDS and HPCTS versus EUV lithography power.

FIG. 10 is a graph illustrating the average remaining thickness of photoresist on HMDS and HPCTS-primed silicon substrates versus EUV lithography power.

Figure 11:
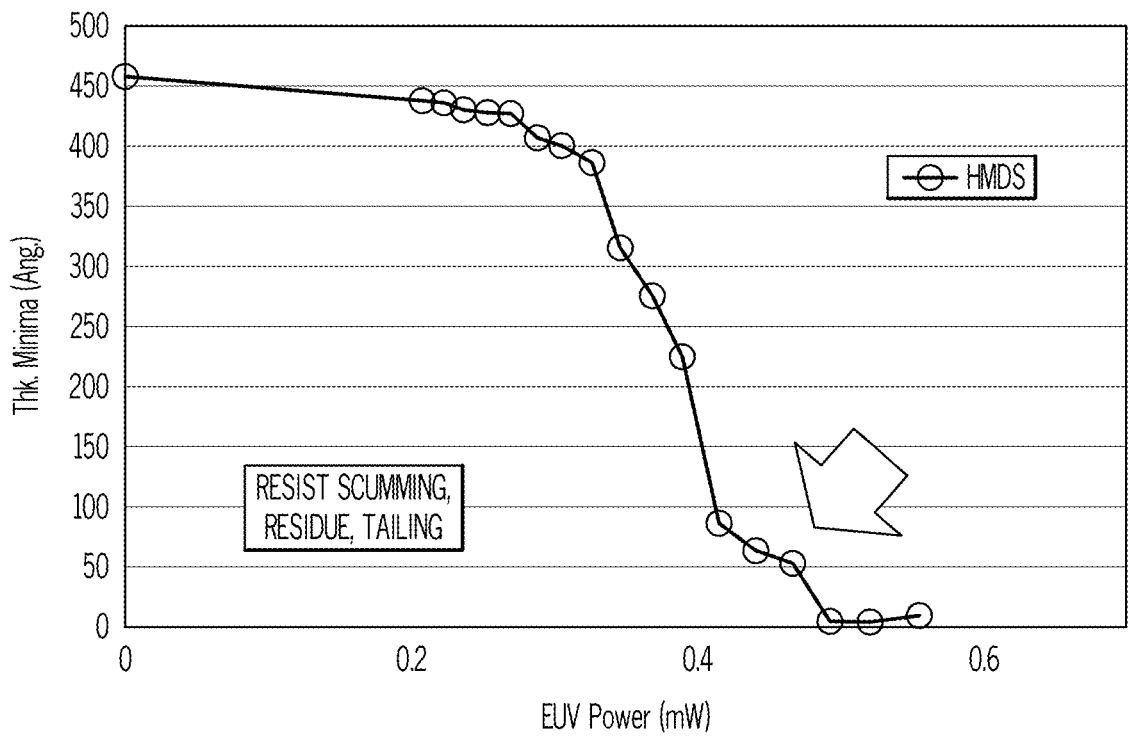
FIG. 11 is a graph showing the control of scumming, residue and tailing by illustrating thickness versus EUV power.

FIG. 11 is a graph showing the control of scumming, residue and tailing by illustrating thickness versus EUV power. The y-axis is the thickness of the photoresist in Angstroms and the X-axis the EUV Power in milliwatts. This graph shows the photosensitivity curve of a photoresist on a substrate primed with one coat of HMDS.

Figure 12:
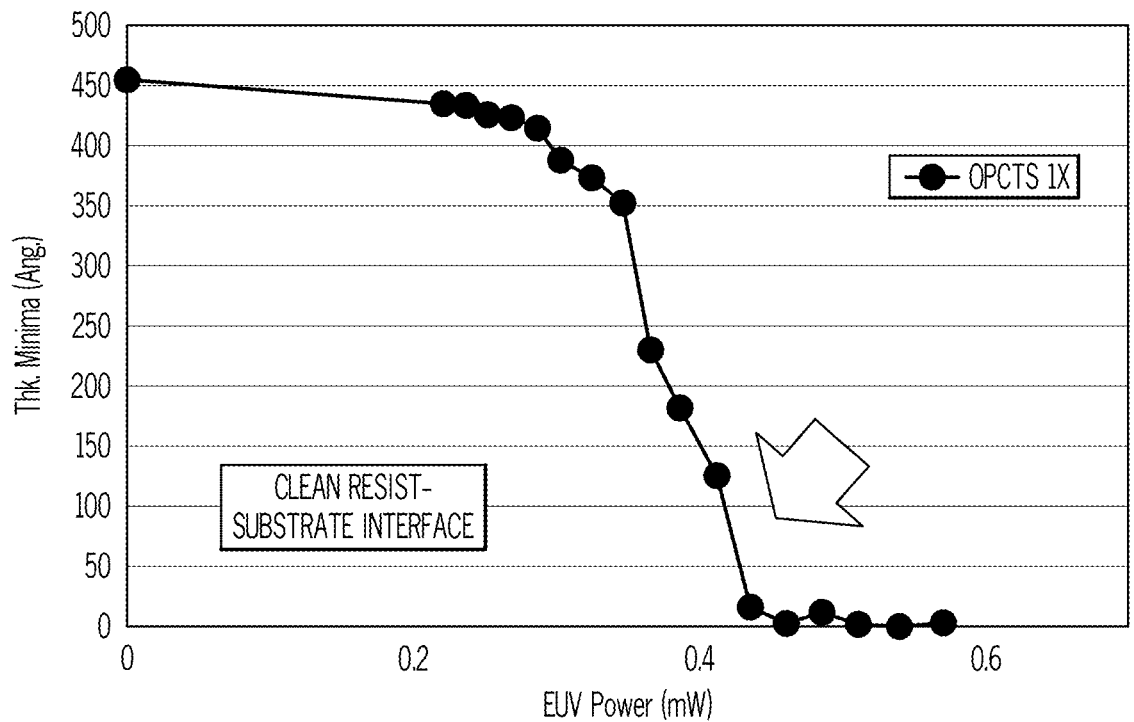
FIG. 12 is a graph showing the control of scumming, residue and tailing by illustrating thickness versus EUV power.

FIG. 12 is a graph showing the control of scumming, residue, and tailing by illustrating thickness versus EUV power. The y-axis is the thickness of the photoresist in Angstroms and the X-axis the EUV Power in milliwatts. This graph shows the photosensitivity curve of a photoresist on a substrate primed with one coat of OPCTS. OPCTS 2% PGMEA, 1 krpm, 180 C/60 s—PGMEA rinse. Commercial EUV resist, 1.5 krpm, 130 C/60 s. EUV exposed at incrementally higher power values. PEB 110 C/60 s. Development TMAH 0.26N/30 s. DI H2O rinse/spin dry. Film thickness measurement by ellipsometry to generate contrast curves.

Figure 13:
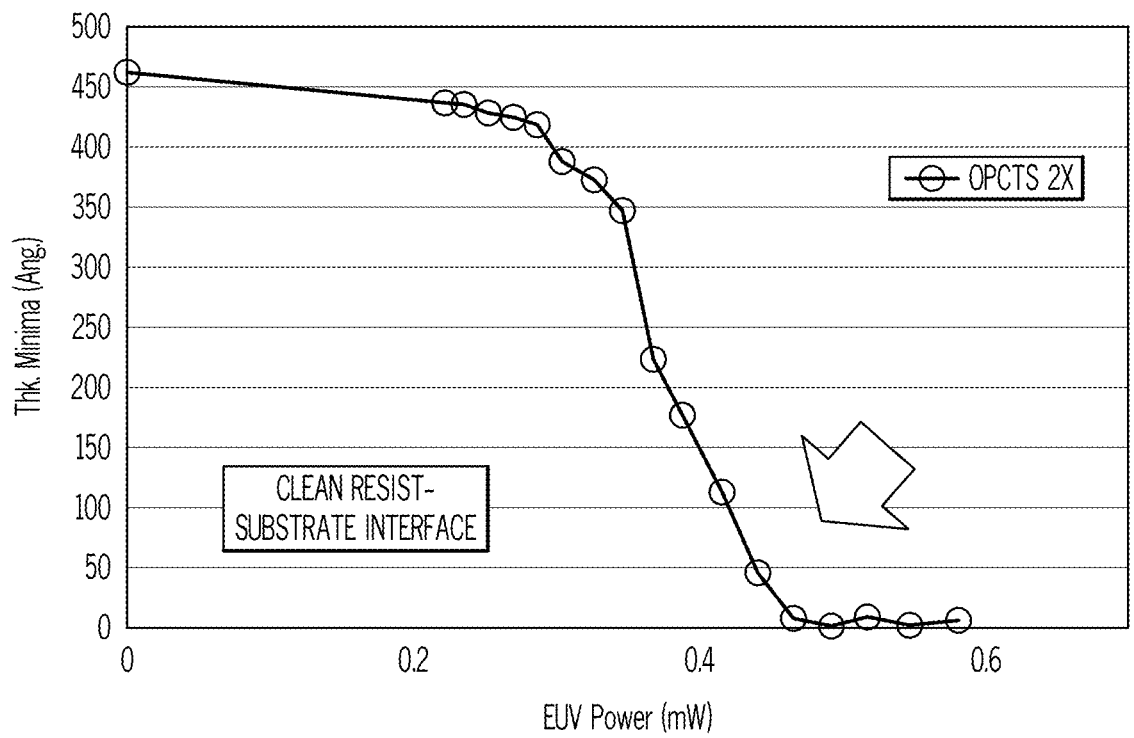
FIG. 13 is a graph showing the control of scumming, residue and tailing by illustrating thickness versus EUV power.

FIG. 13 is a graph showing the control of scumming, residue, and tailing by illustrating thickness versus EUV power. The y-axis is the thickness of the photoresist in Angstroms and the X-axis the EUV Power in milliwatts. This graph shows the photosensitivity curve of a photoresist on a substrate primed with two coatings of OPCTS. OPCTS 2% PGMEA, 1 krpm, 180 C/60 s—PGMEA rinse—Coated/baked/rinsed 2×. Commercial EUV resist, 1.5 krpm, 130 C/60 s. EUV exposed at incrementally higher power values. PEB 110 C/60 s. Development TMAH 0.26N/30 s. DI H2O rinse/spin dry. Film thickness measurement by ellipsometry to generate contrast curves The shape of the curves in FIGS. 11 through FIG. 13 are contrast curves created by taking a blanket photosensitive film of photoresist and expose it to increasing EUV power doses. After exposure and development, the thickness is measured and the result is the photosensitivity curve of a photoresist. As the graphs show, there is a sharper interfacial profile with OPCTS as compared to HMDS.

As shown by the arrow in FIG. 11, when the resist is about to approach zero, it creates a tail, i.e., a signature for scumming and residue. This is the effect of HMDS on certain surfaces, at approximately 0.4 mW ,where materials are supposed to dissolve but it does not. As FIGS. 12 and 13 show, the use of OPCTS can correct this scumming, residue, tailing problem.

Some of the compounds described above are solids at room temperature. In the priming step of a semiconductor manufacturing process, one or more of the cyclic or non-cyclic compounds is mixed with one or more casting solvents to make a liquid formulation for the adhesion promoter composition. The adhesion promoter composition is deposited using spin-on coating onto the surface of the wafer by pouring a small amount of liquid on the surface of interest to be modified or primed. The wafer is spun at a certain speed so that the material can spread on the surface of the wafer. The liquid formulation evaporates forming a solid residue film. Next, the wafer is placed on a hot plate and the composition reacts with the surface of the wafer.

The one or more casting solvents are any solvents known in the art which effectively solubilize the cyclic molecular adhesion promoter. The solvent may be any solvent conventionally used with spin coat methods, and which does not have a substantial negative impact on the performance of the cyclic molecular adhesion promoter composition. Some examples of solvents include 3-pentanone, Methyl lsobutyl Ketone (MIBK), Propylene glycol methyl ether (1 -Methoxy 2-propanol), Methyl Cellosolve (2-Methoxyethanol), Butyl Acetate, 2-ethoxyethanol, Propylene glycol methyl ether acetate (PGMEA), Propylene glycol propyl ether (1-Propoxy-2-propanol, Dowanol PnP), 4-heptanone, 3-heptanone, 2-heptanone, N,N-dimethylformamide, Anisole, Ethyl Lactate, Cyclohexanone, Cellosolve Acetate (Ethylene glycol ethyl ether acetate), N-dimethylacetamide, Diglyme (2-methoxy ethyl ether), Ethyl 3-ethoxy propionate, Dimethyl Sulfoxide, Di(propylene glycol)methyl ether (DOWANOL), Di(ethylene glycol)methyl ether, Diethylmalonate, 2-(2-butoxy ethoxy ethanol) (DEGBE) and gamma-butyrolactone.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming an adhesion promoter on a surface of a substrate, the method comprising:

preparing an adhesion promoter composition including at least one cyclic compound or at least one non-cyclic compound, the cyclic compound having a formula,

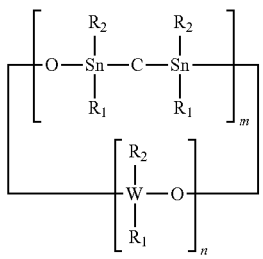

and the non-cyclic compound having a formula,

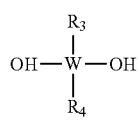

wherein:
R$_1$ and R$_2$ each independently represents a non-photoactive phenyl, a photoactive phenyl, or a C$_1$-C$_4$ alkyl;
R$_3$ represents a non-photoactive phenyl;
R$_4$ represents a photoactive phenyl;
W represents silicon (Si) or germanium (Ge);
n represents an integer greater than or equal to 1; and
m represents an integer of 0 or 1;
   combining the at least one cyclic compound or the at least one non-cyclic compound with at least one casting solvent, thereby forming a liquid adhesion promoter composition;
   spin coating the liquid adhesion promoter composition on the surface of the substrate, evaporating the liquid and thereby forming a solid adhesion promoter composition on the surface of the substrate;
   baking the substrate such that the solid adhesion promoter composition reacts with the surface of the substrate, thereby forming the adhesion promoter on the surface of the substrate, the adhesion promoter having a thickness between 1.32 nm and 1.70 nm; and
   rinsing the adhesion promoter on the surface of the substrate with the at least one casting solvent.

2. The method according to claim 1, wherein W represents silicon (Si) and the substrate is a silicon substrate.

3. The method according to claim 1, wherein a temperature range for the baking is from 80° C. to 180° C.

4. The method according to claim 1, wherein the solid adhesion promoter composition is a film on the surface of the substrate.

5. The method according to claim 1, wherein the adhesion promoter composition prepared includes the at least one cyclic compound.

6. A semiconductor comprising an adhesion promoter formed according to the method of claim 1.

7. The method according to claim 1, wherein the at least one cyclic compound is hexaphenylcyclotrisiloxane.

8. The method according to claim 1, wherein the at least one cyclic compound is 2,4,6-trimethyl-2,4,6-triphenylcyclotrisiloxane.

9. The method according to claim 1, wherein the at least one cyclic compound is triphenylsulfonium 4-phenylsulfonate-2,2,4, 6, 6-pentaphenyl-cyclotrisiloxane.

10. The method according to claim 5, wherein R$_1$ and R$_2$ are non-reactive phenyl.

11. The method according to claim 10, wherein W is silicon (Si).

12. The method according to claim 11, wherein n is 3.

13. The method according to claim 12, wherein m is 0.

14. A method for forming an adhesion promoter on a surface of a silicon substrate, the method comprising:
   preparing an adhesion promoter composition including at least one cyclic compound having a formula

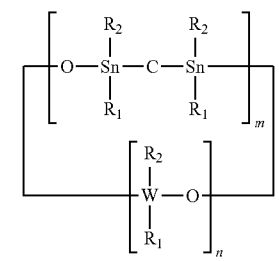

wherein:
R$_1$ and R$_2$ each independently represents a non-photoactive phenyl;
W represents silicon (Si);
n represents an integer of 3; and
m represents an integer of 0;
   combining the at least one cyclic compound with at least one casting solvent, thereby forming a liquid adhesion promoter composition;
   spin coating the liquid adhesion promoter composition on the surface of the silicon substrate, evaporating the liquid and thereby forming a solid adhesion promoter composition on the surface of the silicon substrate;
   baking the silicon substrate such that the solid adhesion promoter composition reacts with the surface of the silicon substrate, thereby forming the adhesion promoter on the surface of the silicon substrate, the adhesion promoter having a thickness between 1.32 nm and 1.70 nm; and
   rinsing the adhesion promoter on the surface of the substrate with the at least one casting solvent.

15. The method according to claim 14, wherein the at least one cyclic compound is hexaphenylcyclotrisiloxane.

16. The method according to claim 14, wherein a temperature range for the baking is from 80° C. to 180° C.

17. The method according to claim 14, wherein the solid adhesion promoter composition is a film on the surface of the silicon substrate.

18. A semiconductor comprising an adhesion promoter formed according to the method of claim 14.

19. A method for forming an adhesion promoter on a surface of a substrate, the method comprising:
   preparing an adhesion promoter composition including at least one cyclic compound or at least one non-cyclic compound, the cyclic compound having a formula,

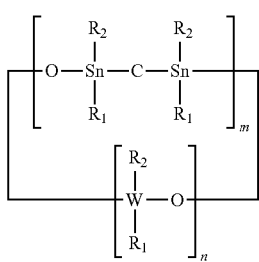

and the non-cyclic compound having a formula,

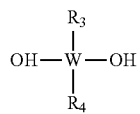

wherein:

$R_1$ and $R_2$ each independently represents a non-photoactive phenyl, a photoactive phenyl, or a $C_1$-$C_4$ alkyl;

$R_3$ represents a non-photoactive phenyl;
$R_4$ represents a photoactive phenyl;
W represents silicon (Si) or germanium (Ge);
n represents an integer greater than or equal to 1; and
m represents an integer of 0 or 1;

combining the at least one cyclic compound or the at least one non-cyclic compound with at least one casting solvent, thereby forming a liquid adhesion promoter composition;

spin coating the liquid adhesion promoter composition on the surface of the substrate, evaporating the liquid and thereby forming a solid adhesion promoter composition on the surface of the substrate;

baking the substrate at a temperature from 80° C. to 180° C. such that the solid adhesion promoter composition reacts with the surface of the substrate, thereby forming the adhesion promoter on the surface of the substrate, the adhesion promoter having a thickness between 1.32 nm and 1.70 nm; and rinsing the adhesion promoter on the surface of the substrate with the at least one casting solvent.

20. A semiconductor comprising an adhesion promoter formed according to the method of claim 19.

21. The method according to claim 1, where m is 1.

* * * * *